United States Patent
McAlister

(10) Patent No.: US 7,221,564 B2
(45) Date of Patent: May 22, 2007

(54) LOW-PROFILE BOX CHANNEL SUPPORT BEAM CONFIGURATION

(75) Inventor: Robert M. McAlister, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 253 days.

(21) Appl. No.: 10/629,252

(22) Filed: Jul. 29, 2003

(65) Prior Publication Data

US 2005/0024818 A1    Feb. 3, 2005

(51) Int. Cl.
G06F 1/16 (2006.01)
H05K 5/00 (2006.01)
H05K 7/00 (2006.01)

(52) U.S. Cl. .................................. 361/683
(58) Field of Classification Search .............. 361/683, 361/724–728, 773, 774; 174/63, 260; 439/66; 324/762, 754
See application file for complete search history.

(56) References Cited

U.S. PATENT DOCUMENTS

| | | | |
|---|---|---|---|
| 5,175,669 A * | 12/1992 | Navia et al. ................ | 361/683 |
| 5,457,608 A | 10/1995 | Scholder et al. | |
| 5,584,396 A * | 12/1996 | Schmitt ........................ | 211/26 |
| 5,626,406 A * | 5/1997 | Schmid ................... | 312/334.28 |
| 5,661,640 A | 8/1997 | Mills et al. | |
| 5,816,673 A * | 10/1998 | Sauer et al. .............. | 312/223.2 |
| 5,838,538 A | 11/1998 | Yee | |
| 6,621,711 B1 * | 9/2003 | Haworth et al. ............ | 361/796 |

OTHER PUBLICATIONS

Compaq Maintenance and Service Guide-Compaq Evo N600c, Aug. 2001.

* cited by examiner

Primary Examiner—Dean A. Reichard
Assistant Examiner—Ivan Carpio
(74) Attorney, Agent, or Firm—Haynes and Boone, LLP

(57) ABSTRACT

A support apparatus includes a first member and a second member. Each member has a first and a second portion. The first portions of the members are spaced apart and the second portions of the members are interconnected. The first member is a ribbed member in a first orientation and the second member is a ribbed member, identical to the first ribbed member, attached to the first ribbed member in a second orientation inverted from the first orientation.

18 Claims, 3 Drawing Sheets

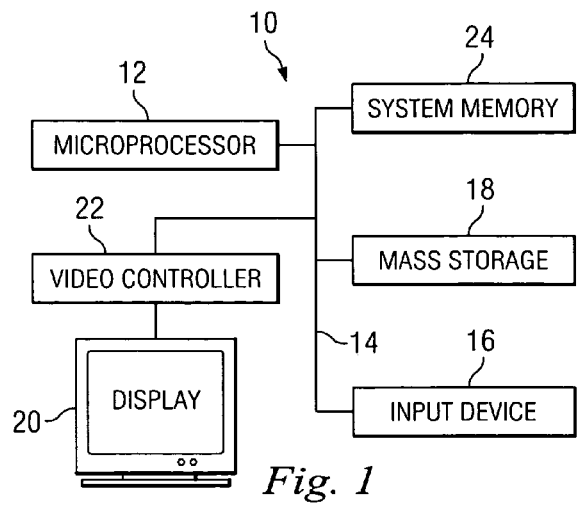
Fig. 1
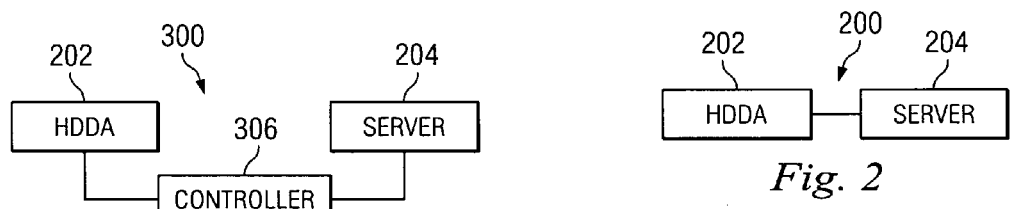
Fig. 3
Fig. 2
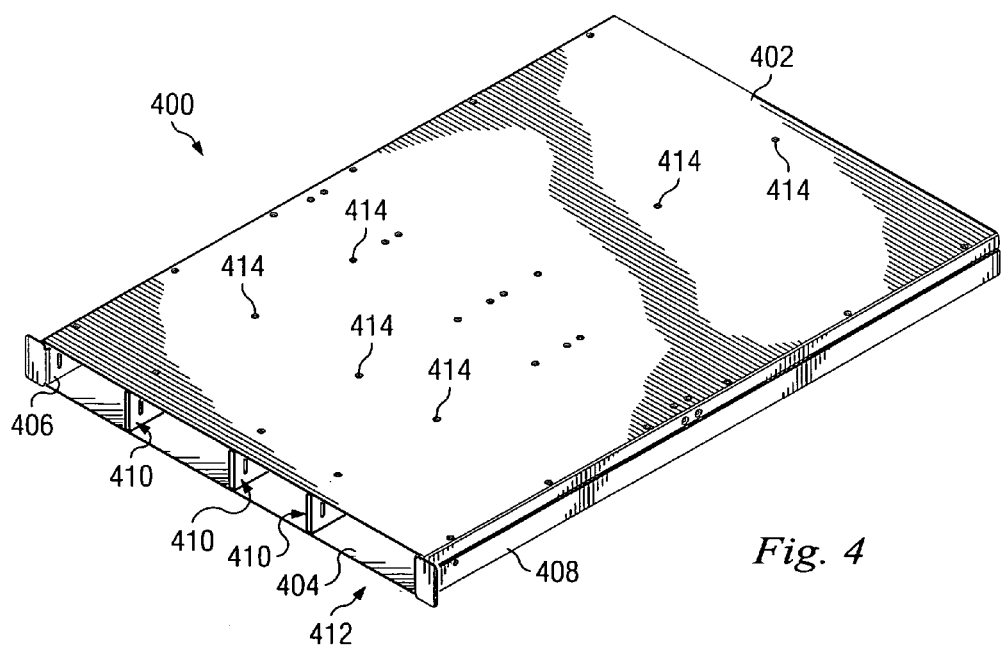
Fig. 4

LOW-PROFILE BOX CHANNEL SUPPORT BEAM CONFIGURATION

BACKGROUND

The present disclosure relates generally to information handling systems, and more particularly to a support member for a computer chassis.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Many different chassis are used in information handling system. These chassis support many different components. The various chassis include for example, computer chassis, storage chassis and server chassis. Storage and server chassis enclosures often "bow" or "sag" in rack mount applications due to thin sheet metal construction and dense electronics packaging. Maximizing internal chassis volume is critical, and reducing overall chassis height to offset bowing sacrifices precious internal chassis volume. Therefore, a support member of improving structural integrity without consuming large amounts of internal chassis volume is needed.

Accordingly, it would be desirable to provide a support member for an information handling system absent the disadvantages found in the prior methods discussed above.

SUMMARY

According to one embodiment, a support apparatus is provided which includes a first member and a second member. Each member has a first and a second portion. The first portions of the members are spaced apart and the second portions of the members are interconnected.

A principal advantage of this embodiment is that increased support is provided in a chassis used in information handling systems without sacrificing valuable real estate needed for system components.

BRIEF DESCRIPTION OF THE DRAWINGS

FIG. 1 is a diagrammatic view illustrating an embodiment of an information handling system.

FIG. 2 is a diagrammatic view illustrating an embodiment of various computer chassis.

FIG. 3 is a diagrammatic view illustrating another embodiment of various computer chassis.

FIG. 4 is a perspective view illustrating an embodiment of a controller chassis.

DETAILED DESCRIPTION

Figure 5:
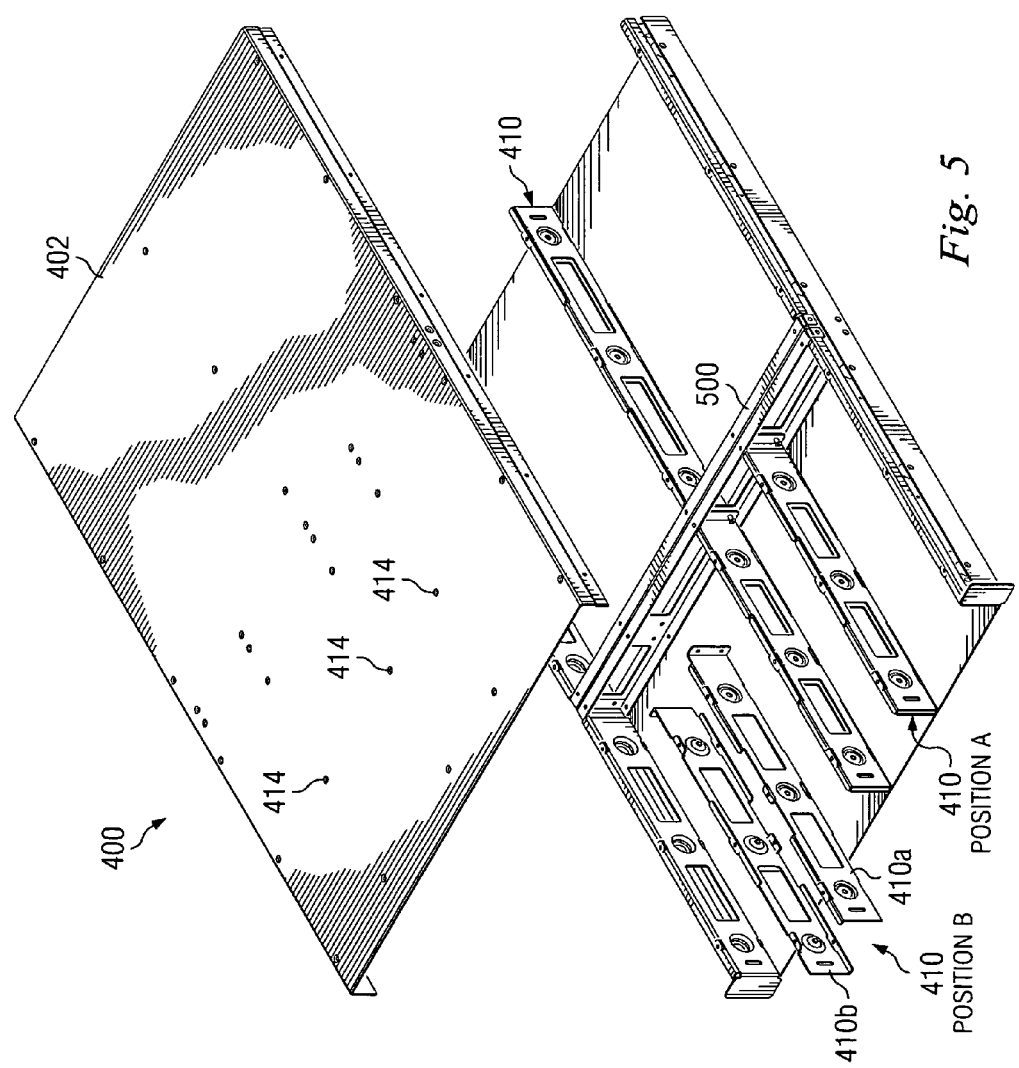
FIG. 5 is an exploded view of the chassis of FIG. 4

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

In one embodiment, information handling system 10, FIG. 1, contained in one or more chassis includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

A portion of a computer system 200, FIG. 2, may be comprised of chassis, or storage boxes, which may be rack mounted, and may include a hard disk drive array (HDDA) 202 coupled to a server 204, according to one embodiment.

In one embodiment, a system 300, FIG. 3, may be comprised of a chassis which may be rack mounted, and may include a HDDA 302, and a server 304 coupled to a controller 306 which takes over the burden of allocating files.

In the embodiment of FIG. 2, the chassis containing the HDDA 202 may include a plurality of drive units along with cooling apparatus. In the embodiment of FIG. 3, the chassis containing the controller 306 may include blowers for cooling, power supplies and controller (PC) boards.

One such chassis 400 embodiment is illustrated in FIG. 4, and includes relatively thin outer walls including an upper wall 402, a lower wall 404, a first sidewall 406 and a second sidewall 408. A plurality of support members 410 are partially exposed at an open end 412 of chassis 400. The upper wall 402 and lower wall 404 each include a plurality of apertures 414 which permit a fastener to attach the support members 410 and other members (not shown) to be secured to the chassis 400.

The support members 410, FIG. 5, are provided to resist bowing or sagging of the chassis 400. Each support member 410, position A, is a double-walled member formed of two identical members, position B, each having interlocking portions and overlapping portions as will be explained in detail below.

Each support member includes a first member 410a and an identical second member 410b. Therefore, for brevity, only one of the members will be described except where reference to both members 410a and 410b best provides a thorough understanding of the embodiments.

Figure 6:
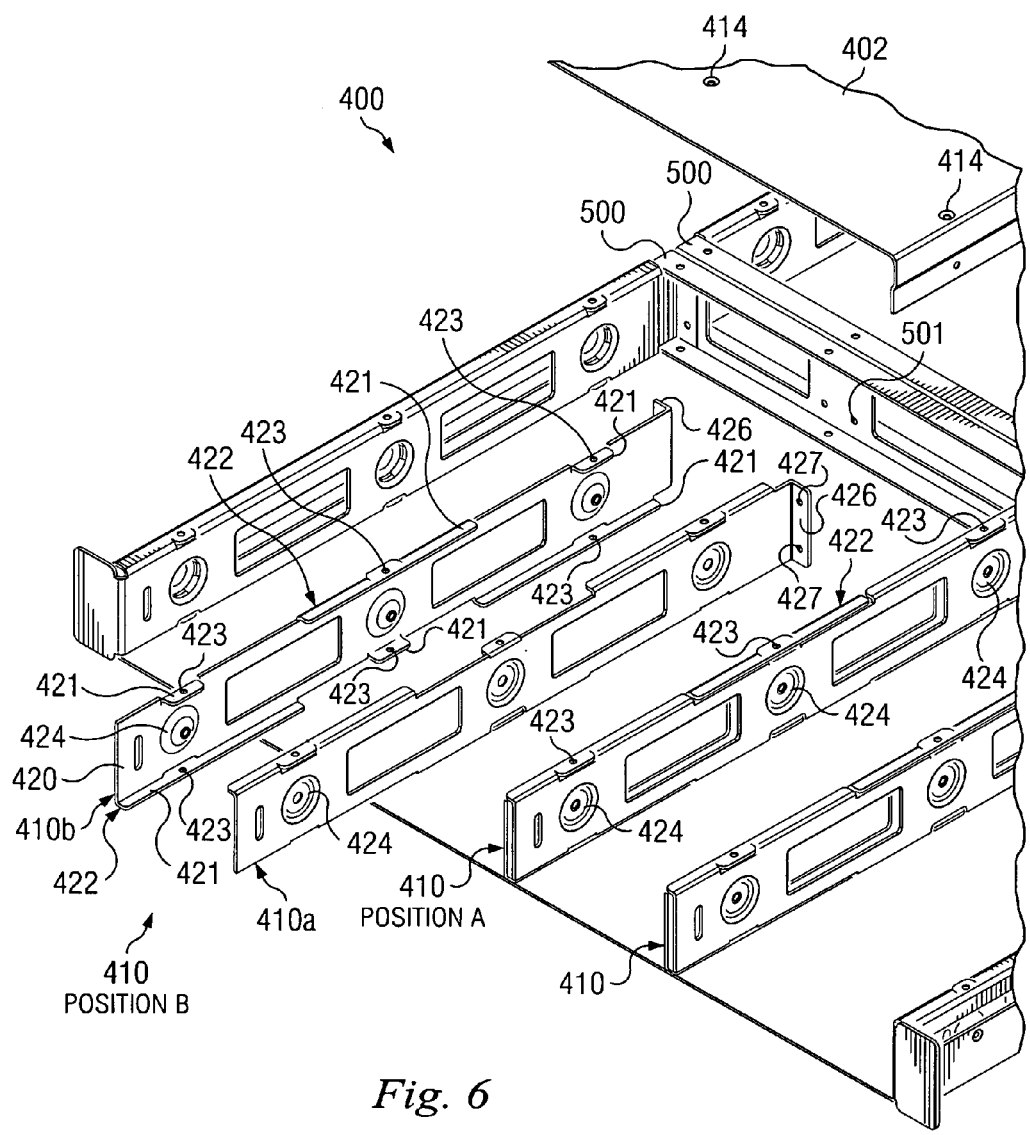
FIG. 6 is an enlarged exploded view of the chassis of FIG. 5.

A first portion of member 410a, FIG. 6, includes a span 420 and a second portion of member 410 includes a pair of ribs 422 which are spaced apart by the span 420. Each rib 422, position B, includes a plurality of sections 421 and each section 421 is substantially perpendicular to its respective span 420. Also, each section 421 includes apertures 423 for receiving a fastener. Further, the span 420 includes a plurality of dimpled portions 424. At one end of each member 410a, 410b is a flange 426 which includes apertures 427.

The rib 422 on one side of the span 420 includes sections 421 which are spaced apart differently than the sections 421 on another side of the span 420. This is done so that when the first portion 410a is in a first orientation, and is joined with the second portion 410b, which is inverted to a second orientation, the rib sections 421 interlock and overlap in a manner so as to form a substantially continuous rib 422 on each side of the span 420, position A. Also, the dimpled portions 424 of first portion 410a abut for fastening to the dimpled portions 424 of second portion 410b.

The rib sections 421, FIGS. 4, 5 and 6, overlap only at positions where the apertures 423 are provided. This provides for fastening the portions 410a and 410b together and also provides for fasteners to be extended through the apertures 414 in the upper wall 402 and lower wall 404 of the chassis 400.

A plurality of the assembled support members 410 may also be attached to a common mid-support 500. This is accomplished by extending fasteners through the apertures 427 of flanges 426 and into connection with apertures 501 in mid-support 500.

The support member described is fundamentally an assembly of two U-channel elements which, when combined together and secured to upper and lower chassis covers, forms an extremely strong, low profile box-channel support beam configuration. The approach is unique in that it uses double-walled vertical supports rather than single-wall supports. The double-walled supports are constructed of two identical parts, which simplifies the design and reduces tooling costs. Preliminary structural testing with early prototypes shows an approximate 400% increase in structural rigidity over typical production chassis enclosures.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A support apparatus comprising: a first member in a first orientation having a first portion and a second portion; a second member, separate from the first member, in a second orientation inverted from the first orientation, the second member being identical to the first member, and having a first portion and a second portion; the first portions of the first and second members being spaced apart; and the second portions of the first and second members including overlapping interlocking sections such that the first and second members are interconnected and form an interlocking continuous double-walled reinforcing member, wherein the first portions of each member include a span and the second portions of each member include a rib.

2. The support apparatus as defined in claim 1 wherein some of the second portions of the first member overlap some of the second portions of the second member.

3. The support apparatus as defined in claim 1 wherein the first member is a ribbed member and the second member is a ribbed member, identical to the first ribbed member.

4. A support apparatus comprising:
a first ribbed member in a first orientation; and
a second ribbed member, identical to, and separate from, the first ribbed member and attached to the first ribbed member in a second orientation inverted from the first orientation, the first and second members each including a span and overlapping interlocking sections whereby the first and second members are joined to form a continuous double-walled reinforcing member.

5. The support apparatus as defined in claim 4 wherein portions of the first ribbed member overlap portions of the second ribbed member.

6. The support apparatus as defined in claim 5 wherein the first and second ribbed members are attached at a position wherein the overlap occurs.

7. A computer comprising: a chassis; and a support member mounted in the chassis, the support member including: a first member in a first orientation having a first portion and a second portion; a second member, separate from the first member, in a second orientation inverted from the first orientation, the second member being identical to the first member, and having a first portion and a second portion; the first portions of the first and second members being spaced apart;
and the second portions of the first and second members including overlapping interlocking sections such that the first and second members are interconnected and form an interlocking continuous double-walled reinforcing member, wherein the first portions of each member includes a span and the second portions of each member include a rib.

8. The computer as defined in claim 7 wherein some of the second portions of the first member overlap some of the second portions of the second member.

9. The computer as defined in claim 7 wherein the first member is a ribbed member and the second member is a ribbed member, identical to the first ribbed member.

10. An information handling system comprising: a chassis; a microprocessor mounted in the chassis; a storage coupled to the microprocessor; and a support member mounted in the chassis, the support member including: a first member in a first orientation having a first portion and a second portion;
a second member, separate from the first member, having a first portion and a second portion, the second member being identical to the first member and being in a second orientation inverted from the first orientation; the first portions of the first and second members being spaced apart; and the second portions of the first and second members including overlapping interlocking sections such that the first and second members are interconnected and form an interlocking continuous double-walled reinforcing member;

wherein the first portions of each member include a span and the second portions of each member include a rib.

11. The system as defined in claim 10 wherein some of the second portions of the first member overlap some of the second portions of the second member.

12. The system as defined in claim 10 wherein the first member is a ribbed member and the second member is a ribbed member, identical to the first ribbed member.

13. The system as defined in claim 11 wherein the first and second members are attached at a position wherein the overlap occurs.

14. The system as defined in claim 10 wherein the support member is secured between a pair of opposed surfaces in the chassis.

15. The system as defined in claim 10 wherein the first and second members each include a flange.

16. The system as defined in claim 15 wherein each flange is attached to the chassis.

17. A method of reinforcing a computer chassis comprising:

providing a first ribbed member in a first orientation;

providing a second ribbed member, identical to, and separate from, the first ribbed member, in a second orientation inverted from the first orientation;

attaching the first ribbed member to the second ribbed member, each member including a span and overlapping interlocking sections whereby the first and second members are joined to form a continuous double-walled reinforcing member; and securing the attached ribbed members in the computer chassis.

18. The method as defined in claim 17 wherein the attached ribbed members are secured between a pair of opposed surfaces in the computer chassis.

* * * * *

UNITED STATES PATENT AND TRADEMARK OFFICE
CERTIFICATE OF CORRECTION

| | | |
|---|---|---|
| PATENT NO. | : 7,221,564 B2 | Page 1 of 1 |
| APPLICATION NO. | : 10/629252 | |
| DATED | : May 22, 2007 | |
| INVENTOR(S) | : Robert R. McAlister | |

It is certified that error appears in the above-identified patent and that said Letters Patent is hereby corrected as shown below:

Title page, item [75] Inventor; delete "M." and insert --R.--.

Signed and Sealed this

Thirtieth Day of June, 2009

JOHN DOLL
*Acting Director of the United States Patent and Trademark Office*